(12) United States Patent
Bendelli et al.

(10) Patent No.: US 6,783,393 B2
(45) Date of Patent: Aug. 31, 2004

(54) PACKAGE FOR OPTO-ELECTRICAL COMPONENTS

(75) Inventors: Giampaolo Bendelli, Almese (IT); Enrico Di Mascio, Sulmona (IT); Mario Puleo, Borgosesia (IT); Marco Scofet, Rivarolo C.se (IT)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/255,756

(22) Filed: Sep. 27, 2002

(65) Prior Publication Data

US 2003/0073347 A1 Apr. 17, 2003

(30) Foreign Application Priority Data

Sep. 27, 2001 (EP) .............................................. 01308222

(51) Int. Cl.[7] .................................................. H01R 9/22
(52) U.S. Cl. ......................................... 439/577; 385/92
(58) Field of Search .............................. 439/577, 76.1, 439/894; 385/92

(56) References Cited

U.S. PATENT DOCUMENTS

| | | | | |
|---|---|---|---|---|
| 4,722,586 A | * | 2/1988 | Dodson et al. ............... | 385/92 |
| 5,011,246 A | * | 4/1991 | Corradetti et al. ............ | 385/92 |
| 5,011,256 A | * | 4/1991 | Johnson et al. ............... | 385/92 |
| 5,202,943 A | * | 4/1993 | Carden et al. ................ | 385/92 |
| 5,436,997 A | * | 7/1995 | Makiuchi et al. ............. | 385/92 |
| 5,535,034 A | | 7/1996 | Taniguchi | |
| 5,748,822 A | * | 5/1998 | Miura et al. .................. | 385/90 |
| 5,940,563 A | | 8/1999 | Kobayashi et al. | |

FOREIGN PATENT DOCUMENTS

| | | |
|---|---|---|
| EP | 0 953 856 A2 | 11/1999 |
| WO | 87/02833 | 5/1987 |

* cited by examiner

Primary Examiner—Michael C. Zarroli

(57) ABSTRACT

A package for opto-electrical components includes a casing having a chamber, and an optical feed-through between the chamber and the casing exterior. At least one board or tile adapted to carry opto-electrical components is in the chamber. The board or tile creates a solid mechanical structure with the casing while providing electrical ohmic connections with a set of electrical connections on the casing. The board or tile is from of an assortment of boards or tiles of different types.

28 Claims, 1 Drawing Sheet

PACKAGE FOR OPTO-ELECTRICAL COMPONENTS

FIELD OF INVENTION

The present invention relates to packages for opto-electrical components, the term "opto-electrical components" being used herein to designate in general those circuits, assemblies or sub-assemblies comprising electrical, optical as well as optoelectronic (e.g., photodetectors, laser sources, etc.) devices. Exemplary of such packages are transmitter/receiver packages for optical transmission systems.

BACKGROUND ART

Such packages must in general comply with a number of requirements which are at least partly conflicting among them. For instance, the package structure should provide all the external constant electrical connections both at radio frequency (RF) and DC, and optical feed-through, as well as mechanical protection. Flexibility in the internal layout is also an extensively felt need, in that such a layout should be preferably chosen depending on the configuration of components to be included in the device. Electrical connections should be ensured with a high degree of reliability, the same also applying to the mechanical structure of the package. Finally, assembling the package should be easy, leaving a reasonable degree of freedom of movement.

Such requirements do not appear to be satisfactorily met by prior art package solutions which generally are provided for a fixed design.

The object of the present invention is thus to provide an improved solution which better complies with the needs outlined in the foregoing.

SUMMARY OF THE INVENTION

According to the present invention, a package for opto-electrical components comprises a casing including (1) a chamber, (2) at least one of a set of electrical connections, and (3) an optical feed-through path between the chamber and the outside of the casing. At least one board or tile adapted to be housed in the chamber is adapted to carry the opto-electrical components. The board or tile adapted to be housed in the chamber creates a solid mechanical structure with the casing while providing electrical connections therewith.

The casing preferably includes: (1) a box-like portion defining the chamber, and (2) a base member supporting the box-like portion and having a protruding end carrying the set of electrical connections.

The electrical connections are preferably in the form of strip-like formations. The box-like portion preferably includes an opening defining the optical feed-through path. The opening is preferably positioned generally opposite the electrical connections. The casing is preferably molded electrical insulating material.

The casing also preferably includes a trench-like formation for receiving the board or tile that is adapted to be connected to the casing by solder.

The board or tile is adapted to be electrically connected to the casing by ball bonding or wedge bonding. The board or tile preferably includes a ceramic substrate and can be from an assortment of boards or tiles of different types.

The package structure of the invention provides all external constant electrical ohmic connections (RF+DC), the optical feed-through as well as the required mechanical protection of the devices located therein. An interchangeable microboard allows flexibility in the internal electrical layout, which can be chosen in a wide gamut of alternative layouts depending on the configuration of the components to be included in the device and inserted in the package e.g. into a proper trench. Each microboard (or "tile") includes tracks and pads appropriate for its supported components (e.g. integrated circuits, optoelectronic components, and so on) allowing a fully reliable ohmic electrical connection.

Preferably, the microboard is soldered to the package thus creating a reliable mechanical structure. Ohmic electrical connections between the microboard and the package are preferably provided through ball bonding or wedge bonding, depending on performance required. The components to be included in the package can at least partly be mounted on the microboard or tile before this is located in the package and soldered thereto, which results in an increased freedom of movement in assembling such components.

The above and still further objects, features and advantages of the present invention will become apparent upon consideration of the following detailed descriptions of one specific embodiment thereof, especially when taken in conjunction with the accompanying drawings.

BRIEF DESCRIPTION OF THE DRAWING

The single FIGURE of the drawing is a perspective view of a preferred embodiment of a package according to the invention.

DETAILED DESCRIPTION OF THE DRAWING

Figure 1:
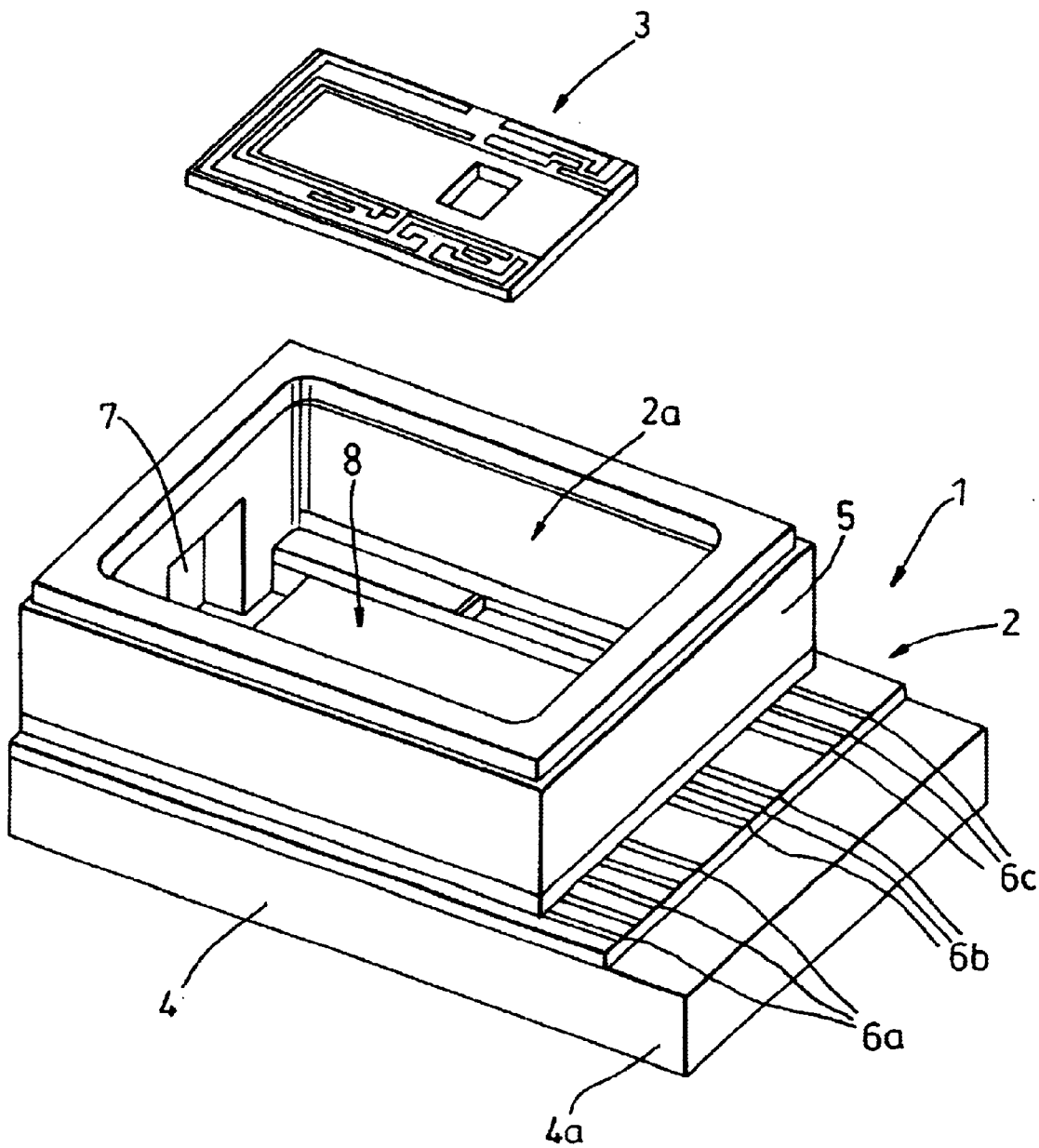

In the drawing, a package 1 includes opto-electrical components that are typically parts of an optical receiver used in high bit-rate optical transmission systems.

Package 1 essentially includes two parts or portions, namely:

(1) a basic structure or casing 2 having preferably an overall vat-like or dish-shaped configuration thus defining a housing chamber 2a therein, and (2) a microboard or "tile" 3 essentially comprised of a card-like member (preferably having the typical structure of a current printed circuit or hybrid circuit board) adapted to be housed in chamber 2a.

The arrangement of package 1 allows different microboards or tiles 3 selected from a wide, virtually infinite, gamut to be assembled into a single type of casing 2 following different needs/operations or requirements.

Preferably, casing 2 includes a flat base member 4 constituting a sort of a socket having one end 4a protruding from the remaining portion of casing 2. This latter portion is essentially comprised of a sort of box-like member 5 extending upwardly from base member 4.

Box-like member 5 (whose internal cavity constitutes chamber 2a) is substantially rectangular in shape. Other shapes (round, oval, etc.) can obviously be chosen. However, a rectangular shape is geld to better fit the shape of microboards or tiles 3, which are usually rectangular.

End 4a of base member 4 carries, on at least one of its surfaces, electrically conductive parts or strips 6a, 6b, 6c which provide constant ohmic connections (RF+DC) between the component receiving volume in chamber 2a intended to house microboards 3 and the outside of package 1.

Preferably, contacts 6a, 6b, 6c are in the form of strip members for enabling ohmic connection of package 1 e.g. to contact leads and/or a flexible ribbon cable (not shown).

The outer, peripheral wall of box-like member 5 of casing 2 also includes at least one opening 7 defining a so-called optical feed-through path i.e. a port for connecting one or more optical fibers (not shown) to respective components to be located within package 1. Preferably, optical feed-through port 7 is located opposite to end 4a carrying electrical connections 6a, 6b, 6c.

Microboard or tile 3 includes tracks and pads (of a known type) adapted to carry the components to be supported by microboard or tile 3. Microboard 3 (or each microboard 3 of a set or assortment of microboards adapted to be assembled into a single type of casing 2) is manufactured by methods which are well known in the area of printed circuit technology or hybrid circuit technology, thus making a detailed description of these methods unnecessary under the circumstances.

The lower portion of housing chamber 2a preferably includes a shallow trench 8 into which microboard or tile 3 can be located.

Microboard or tile 3 is soldered to the rest of the package (essentially to the bottom of trench 8) thus creating a fully reliable mechanical structure inherently resistant to vibration and/or shock. Ohmic electrical connections between microboard or tile 3 (essentially the bottom surface thereof) and the rest of package 1 are preferably provided through ball bonding or wedge bonding depending on performance required.

Specific details of soldering microboard or tile 3 and ball bonding/wedge bonding thereof to casing 2 are not shown in the drawing but will be evident to those skilled in the art.

It will be appreciated that such soldering/bonding techniques are fully compatible with a ceramic substrate for microboards or tiles 3.

Casing structure 2 is advantageously made of a unitary moulded piece of electrical insulating materials, such as a plastics material, which also ensure the required mechanical protection of the components involved.

It will be appreciated that the components intended to be housed in package 1 can be mounted on microboard or tile 3 before the microboard or tile is placed in chamber 2a and finally fixed (e.g. soldered) therein. Such premounting on microboard or tile 3 can include assembling opto-electrical assemblies or sub-assemblies requiring connection and accurate alignment of e.g. optical fibers with respect to optical sources/detectors and/or optical benches currently adopted in such units. Assembling and properly adjusting such arrangements before the respective microboard or tile 3 is assembled into the package is particularly advantageous because such assembling and adjusting steps allow a significantly higher degree of freedom of movement with respect to operations being carried out after board or tile 3 is already located in package 1.

Of course, the basic principle of the invention remaining the same, the details and embodiments may significantly vary with respect to the exemplary embodiment shown and described herein without departing from the scope of the invention, as defined by the annexed claims. This applies particularly, but not exclusively, to the possibility of arranging a plurality of microboards or tiles 3 within a single casing 2.

What is claimed is:

1. In combination,
    a casing including (a) a chamber having a bottom surface, (b) a contact arrangement including a first portion at the bottom surface of the chamber and a second portion outside the chamber, the second portion of the contact arrangement forming accessible contacts for connections to components external to the casing and being electrically connected to the first portion of the contact arrangement, and (c) an optical feed-through between said chamber and the outside of said chamber;
    a board or tile carrying at least one opto-electronic component and including electrical contacts, the board or tile being on the bottom surface of the chamber and overlaying at least some of the first portion of the contact arrangement, the electrical contacts on the board or tile being electrically and mechanically bonded to segments of the first portion of the contact arrangement so the board or tile is resistant to at least one of vibration and shock; and
    at least one optical fiber extending through the port and optically coupled to the opto-electronic component on the board or tile.

2. The combination of claim 1 wherein the bottom surface of the chamber is the bottom surface of a shallow trench in the chamber, the segments of the first portion of the contact arrangement being at the bottom surface of the trench, the board or tile laying in the trench.

3. The combination of claim 2 wherein the casing is constructed so that the chamber has an opening on a face of the chamber, the opening on the face of the chamber leading directly to a sidewall configuration of the chamber, the opening and sidewall configuration being shaped and arranged for enabling the board or tile to be dropped through the opening into the chamber and into the trench onto the bottom surface of the trench and the segments of the first portion of the contact arrangement.

4. The combination of claim 3 wherein the chamber opening and sidewall configuration have a rectangular shape and the board or tile has a rectangular shape.

5. The combination of claim 1 wherein the casing is constructed so that the chamber has an opening on a face of the chamber, the opening on the face of the chamber leading directly to a sidewall configuration of the chamber, the opening and sidewall configuration being shaped and arranged for enabling the board or tile to be dropped through the opening into the chamber onto the bottom surface of the chamber and the segments of the first portion of the contact arrangement.

6. The combination of claim 5 wherein the chamber opening and sidewall configuration have a rectangular shape and the board or tile has a rectangular shape.

7. The combination of claim 1 wherein the contact arrangement includes plural strip line conductors extending longitudinally (a) on the bottom surface of the chamber to form the segments of the first portion of the contact arrangement and (b) to form the second portion of the contact arrangement.

8. The combination of claim 2 wherein the contact arrangement includes plural strip line conductors extending longitudinally (a) on the bottom surface of the trench to form the segments of the first portion of the contact arrangement and (b) to form the second portion of the contact arrangement.

9. The combination of claim 3 wherein the contact arrangement includes plural strip line conductors extending longitudinally (a) on the bottom surface of the trench to form the segments of the first portion of the contact arrangement and (b) to form the second portion of the contact arrangement.

10. The combination of claim 4 wherein the contact arrangement includes plural strip line conductors extending longitudinally (a) on the bottom surface of the trench to form the segments of the first portion of the contact arrangement and (b) to form the second portion of the contact arrangement.

11. The combination of claim 5 wherein the contact arrangement includes plural strip line conductors extending longitudinally (a) on the bottom surface of the chamber to form the segments of the first portion of the contact arrangement and (b) to form the second portion of the contact arrangement.

12. The combination of claim 6 wherein the contact arrangement includes plural strip line conductors extending longitudinally (a) on the bottom surface of the chamber to form the segments of the first portion of the contact arrangement and (b) to form the second portion of the contact arrangement.

13. The combination of claim 1 wherein the optical feed-through is through a first wall of the casing and the contact arrangement is through a second wall of the casing, the first and second walls of the casing being opposite to each other.

14. The combination of claim 7 wherein the optical feed-through is through a first wall of the casing and the strip line conductors extend through a second wall of the casing, the first and second walls of the casing being opposite to each other.

15. The combination of claim 8 wherein the optical feed-through is through a first wall of the casing and the strip line conductors extend through a second wall of the casing, the first and second walls of the casing being opposite to each other.

16. An arrangement comprising
plural casings each having the same configuration;
an assortment of boards or tiles having the same shape, each of the boards or tiles carrying at least one opto-electronic component, the shape of the boards or tiles being such as to enable the boards or tiles to be interchangeably inserted into the plural casings, each of the boards or tiles including electrical contacts;
each of the plural casings including: (a) a chamber having a bottom surface, (b) a contact arrangement including a first portion at the bottom surface of the chamber and a second portion outside the chamber, the second portion of the contact arrangement forming accessible contacts for connections to components external to the casing and being electrically connected to the first portion of the contact arrangement, and (c) an optical feed-through between said chamber and the outside of said chamber;
segments of the first portion of the contact arrangement of each of the plural casings and the electrical contacts of each of the boards or tiles and the configuration of the bottom surface of the chamber being such that when any of the different boards or tiles is at the bottom surface of any of the chambers of any of the casings and electrical connections and mechanical bonds are made between the segments of the first portion of the contact arrangement and the electrical contacts the board or tile is resistant to at least one of vibration and shock.

17. The arrangement of claim 16 wherein the bottom of each of the chambers of each of the casings is formed as a shallow trench, the segments of the first portion of the contact arrangement being at the bottom of the trench, the trench being adapted to enable the board or tile to lay therein.

18. The arrangement of claim 17 wherein each of the casings is constructed so that each of the chambers has an opening on a face of the chamber, the opening on the face of each of the chambers leading directly to a sidewall configuration of the chamber, the opening and sidewall configuration of each of the chambers being shaped and arranged for enabling any of the boards or tiles to be dropped through any of the openings into any of the chambers and into any of the trenches onto any of the bottom surfaces of any of the trenches and the segments of the first portion of any of the contact arrangements.

19. The arrangement of claim 18 wherein the chamber opening and sidewall configuration of each of the casings have a rectangular shape and each of the boards or tiles has a rectangular shape.

20. The arrangement of claim 19 wherein the contact arrangement of each of the casings includes plural strip line conductors extending longitudinally (a) on the bottom surface of the trench of each of the casings to form the segments of the first portion of the contact arrangement and (b) to form the second portion of the contact arrangement.

21. The arrangement of claim 20 wherein the optical feed-through of each of the casings is through a first wall of each of the casings and the strip line conductors of each of the casings extend through a second wall of each of the casings, the first and second walls of each of the casings being opposite to each other.

22. The arrangement of claim 17 wherein the contact arrangement of each of the casings includes plural strip line conductors extending longitudinally (a) on the bottom surface of the trench of each of the casings to form the segments of the first portion of the contact arrangement and (b) to form the second portion of the contact arrangement.

23. The arrangement of claim 16 wherein each of the casings is constructed so that each of the chambers has an opening on a face of the chamber, the opening on the face of each of the chambers leading directly to a sidewall configuration of the chamber, the opening and sidewall configuration of each of the chambers being shaped and arranged for enabling any of the boards or tiles to be dropped through any of the openings into any of the chambers and onto any of the bottom surfaces of any of the chambers and the segments of the first portion of any of the contact arrangements.

24. The arrangement of claim 23 wherein the chamber opening and sidewall configuration of each of the casings have a rectangular shape and each of the boards or tiles has a rectangular shape.

25. The arrangement of claim 16 wherein the contact arrangement of each of the casings includes plural strip line conductors extending longitudinally (a) on the bottom surface of the chamber of each of the casings to form the segments of the first portion of the contact arrangement and (b) to form the second portion of the contact arrangement.

26. The arrangement of claim 16 wherein the optical feed-through of each of the casings is through a first wall of each of the casings and the contact arrangement of each of the casings extends through a second wall of each of the casings, the first and second walls of each of the casings being opposite to each other.

27. A method of making a plurality of packages each including one opto-electrical component, the method being performed on the arrangement of claim 16 wherein each of the boards or tiles carries an opto-electrical assembly mounted on the board or tile before the following steps are performed:
for a first of the packages: inserting a first of the boards or tiles having into the chamber of a first of the casings so the first board or tile is at the bottom surface of the chamber of the first casing; while the first board or tile is at the bottom surface of the chamber of the first casing, (a) electrically connecting and mechanically bonding the electrical contacts of the first board or tile to segments of the first portion of the contact arrangement of the first casing in such a manner that the first board or tile is resistant to at least one of vibration and shock, and (b) inserting at least one first optical fiber through the port of the first casing so the at least one optical fiber is optically coupled to the opto-electronic component on the first board or tile;

for a second of the packages: inserting a second of the boards or tiles into the chamber of a second of the casings so the second board or tile is at the bottom surface of the chamber of the second casing; while the second board or tile is at the bottom surface of the chamber of the second casing, (a) electrically connecting and mechanically bonding the electrical contacts of the second board or tile to segments of the first portion of the contact arrangement of the second casing in such a manner that the second board or tile is resistant to at least one of vibration and shock, and (b) inserting at least one second optical fiber through the port of the second casing so the at least one second optical fiber is optically coupled to the opto-electronic component on the second board or tile.

28. The method of claim 27 wherein each of the casings is constructed so that each of the chambers has an opening on a face of the chamber, the opening on the face of each of the chambers leading directly to a sidewall configuration of the chamber, the opening and sidewall configuration of each of the chambers being shaped and arranged for enabling any of the boards or tiles to be dropped through any of the openings into any of the chambers and into any of the trenches onto any of the bottom surfaces of any of the trenches and the segments of the first portion of any of the contact arrangements, the method further comprising loading the first board or tile to the bottom surface of the chamber of the first casing through the opening of the chamber of the first casing and loading the second board or tile to the bottom surface of the chamber of the second casing through the opening of the chamber of the second casing.

* * * * *